(12) United States Patent
Xavier et al.

(10) Patent No.: US 8,324,616 B2
(45) Date of Patent: Dec. 4, 2012

(54) OPTOELECTRONIC DEVICE

(75) Inventors: Bulliard Xavier, Suwon-si (KR);
Woong Choi, Seongnam-si (KR);
Jae-Young Choi, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 319 days.

(21) Appl. No.: 12/700,229

(22) Filed: Feb. 4, 2010

(65) Prior Publication Data

US 2011/0049481 A1 Mar. 3, 2011

(30) Foreign Application Priority Data

Aug. 28, 2009 (KR) .................. 10-2009-0080813

(51) Int. Cl.
*H01L 51/54* (2006.01)

(52) U.S. Cl. .............. 257/40; 257/E51.026; 257/98; 257/642; 257/E27.117; 136/256

(58) Field of Classification Search ............ 257/40, 257/98, 642–643, 759, E39.007, E51.001–E51.052, 257/E27.117–E27.119
See application file for complete search history.

(56) References Cited

U.S. PATENT DOCUMENTS

| | | | |
|---|---|---|---|
| 2005/0121068 A1* | 6/2005 | Sager et al. | 136/252 |
| 2007/0137693 A1* | 6/2007 | Forrest | 136/255 |
| 2008/0203384 A1* | 8/2008 | Akkerman et al. | 257/40 |
| 2009/0109435 A1* | 4/2009 | Kahen et al. | 356/317 |
| 2009/0266418 A1* | 10/2009 | Hu et al. | 136/260 |
| 2009/0269868 A1* | 10/2009 | Stokes et al. | 438/29 |

FOREIGN PATENT DOCUMENTS

| | | |
|---|---|---|
| JP | 2007-270278 A | 10/2007 |
| KR | 1020030023192 A | 3/2003 |
| KR | 1020070082676 A | 8/2007 |
| KR | 1020070086446 A | 8/2007 |
| KR | 100805480 B1 | 2/2008 |
| KR | 1020080022024 A | 3/2008 |

* cited by examiner

*Primary Examiner* — N Drew Richards
*Assistant Examiner* — Mamadou Diallo
(74) *Attorney, Agent, or Firm* — Cantor Colburn LLP

(57) ABSTRACT

An optoelectronic device including a first electrode, an active layer disposed on the first electrode, a second electrode disposed on the active layer, and a self-assembled monolayer interposed between the first electrode and the active layer, interposed between the active layer and the second electrode, or disposed inside the active layer, wherein the self-assembled monolayer includes a first compound and a second compound having different functional groups from each other.

13 Claims, 7 Drawing Sheets

OPTOELECTRONIC DEVICE

CROSS-REFERENCE TO RELATED APPLICATION

This application claims priority to Korean Patent Application No. 10-2009-0080813, filed on Aug. 28, 2009, and all the benefits accruing therefrom under 35 U.S.C. §119, the content of which in its entirety is herein incorporated by reference.

BACKGROUND

1. Field

This disclosure relates to an optoelectronic device.

2. Description of the Related Art

An optoelectronic device is a device that transforms light into electrical energy and electrical energy to light. A solar cell, which is an optoelectronic device, is a photoelectric conversion device that transforms solar energy into electrical energy, and has drawn much attention as a potentially pollution-free next generation energy resource.

A solar cell may be classified as an inorganic solar cell or an organic solar cell, depending on a type of photoactive material in the solar cell. The organic solar cell includes a photoactive layer, which includes an organic compound disposed between two electrodes, and may be manufactured at a low cost compared to an inorganic solar cell, which includes an inorganic material, such as silicon, in a photoactive layer.

A type of optoelectronic device is an organic light emitting diode ("OLED"), which transforms electrical energy into photo-energy (e.g., optical energy) using an organic compound. The OLED may provide excellent luminance and a wide viewing angle, compared to a conventional liquid crystal display ("LCD"), and may facilitate the manufacture of an ultrathin flat panel display because it does not require a backlight.

In order to apply the organic optoelectronic device more broadly, it would be desirable to improve the transforming efficiency, and much research on organic optoelectronic materials, device structure, interface control, shape control, and the like has been performed.

SUMMARY

One aspect, feature, and advantage of this disclosure is an optoelectronic device having improved efficiency.

Disclosed is an optoelectronic device including: a first electrode; an active layer disposed on the first electrode; a second electrode disposed on the active layer; and a self-assembled monolayer interposed between the first electrode and the active layer, interposed between the active layer and the second electrode, or disposed inside the active layer, wherein the self-assembled monolayer includes a first compound and a second compound having different functional groups from each other.

The active layer may include a first active part disposed on the first electrode and a second active part disposed on the second electrode, wherein the self-assembled monolayer may be interposed between the first electrode and the first active part, interposed between the first active part and the second active part, or interposed between the second active part and the second electrode.

The first active part, the second active part, or a combination thereof may include a fine pattern.

The active layer may include an electron donor and an electron acceptor. The active layer may further include a nanostructure, and the nanostructure may contact the first electrode or the second electrode.

The first compound may have the following Chemical Formula 1, and the second compound may have the following Chemical Formula 2:

     Chemical Formula 1

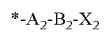     Chemical Formula 2 wherein, in the above Chemical Formulae 1 and 2, $A_1$ and $A_2$ are the same or different, and are independently selected from the group consisting of a thiol derivative, an alcohol derivative, an alkoxysilane derivative, a halosilane derivative, a carboxylic acid derivative, and a combination thereof, $B_1$ and $B_2$ are the same or different, and are independently selected from the group consisting of a single bond, a substituted or unsubstituted $C_1$ to $C_{30}$ alkylene, a substituted or unsubstituted $C_1$ to $C_{30}$ alkenylene, a substituted or unsubstituted $C_1$ to $C_{30}$ alkynylene, a derivative thereof, and a combination thereof, $X_1$ and $X_2$ are functional groups that are different from each other, and are independently selected from the group consisting of hydrogen, a substituted or unsubstituted $C_1$ to $C_{30}$ alkyl, a substituted or unsubstituted $C_2$ to $C_{30}$ alkenyl, a substituted or unsubstituted $C_2$ to $C_{30}$ alkynyl, a substituted or unsubstituted $C_3$ to $C_{30}$ cycloalkyl, a substituted or unsubstituted $C_3$ to $C_{30}$ cycloalkenyl, a substituted or unsubstituted $C_5$ to $C_{30}$ cycloalkynyl, a substituted or unsubstituted $C_1$ to $C_{30}$ alkoxy, a substituted or unsubstituted $C_1$ to $C_{30}$ carbonyl, a substituted or unsubstituted $C_1$ to $C_{30}$ carboxyl, a substituted or unsubstituted $C_2$ to $C_{30}$ (meth)acrylate, a substituted or unsubstituted $C_2$ to $C_{30}$ epoxy, a substituted or unsubstituted $C_6$ to $C_{30}$ aromatic group, a substituted or unsubstituted $C_3$ to $C_{30}$ heterocyclic group, a thiol, a hydroxy, an amine, a nitro, a cyano, a halogen, a derivative thereof, and a combination thereof.

In an embodiment, $X_1$ and $X_2$ are different functional groups from each other, and are independently selected from the group consisting of n-octyl, acetoxy, acetyl, acryloxyethoxy, acryloxy, allylamino, allyl, allyloxy, amino, γ-aminopropyl, benzyl, benzyloxy, carbomethoxy, cyano, cyclopentadienyl, cyclopentyl, glycidoxy, methacryloxy, imidazole, methoxyphenyl, methylamino, methylpropenyl, naphthyl, phenyl, phenoxy, phenylacetoxy, phenylamino, pyridine, pyrrole, tolyl, thiol, vinyl, fluoro, trifluoromethyl, pentafluoroethyl, tridecafluorohexyl, heptadecafluorooctyl, heptadecafluoro-1,1,2,2-tetrahydrodecyl, chloro, bromo, bromophenyl, bromovinyl, iodo, a derivative thereof, and a combination thereof.

In an embodiment, $X_1$ may be a hydrophilic functional group, for example a functional group selected from the group consisting of an amine, a carboxyl, an epoxy, a thiol, a (meth)acrylate, a derivative thereof, and a combination thereof. $X_2$ may be a hydrophobic functional group, for example, a functional group selected from the group consisting of —$CH_3$, —$OCH_3$, a fluorinated derivative thereof such as —$CF_3$, a derivative thereof, and a combination thereof.

In another embodiment, $X_1$ may be an electron donating functional group, for example, a functional group selected from the group consisting of —$NH_2$, —$OCH_3$, —$CH_3$, a derivative thereof, and a combination thereof. $X_2$ may be an electron withdrawing functional group, and for example, a functional group selected from the group consisting of —$NO_2$, —CN, —F, —Br, —SH, a derivative thereof, and a combination thereof.

The optoelectronic device may be a solar cell or an organic light emitting diode ("OLED").

Other aspects of this disclosure will be further described in the following detailed description.

BRIEF DESCRIPTION OF THE DRAWINGS

The above and other aspects, advantages and features of this disclosure will become more apparent by describing in further detail exemplary embodiments thereof with reference to the accompanying drawings, in which.

DETAILED DESCRIPTION

Figure 1:
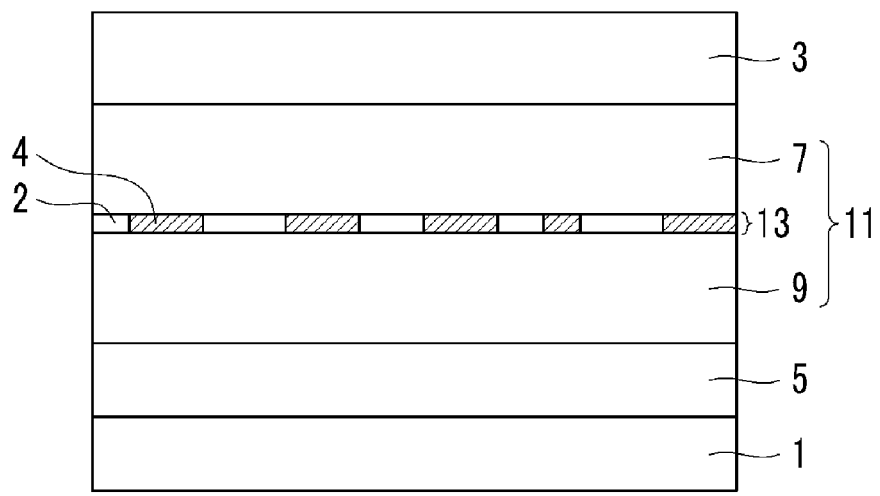
FIG. 1 is a schematic cross-sectional view of an exemplary embodiment of a solar cell.

The present disclosure will be described more fully hereinafter with reference to the accompanying drawings, in which exemplary embodiments of this disclosure are shown. As those skilled in the art would realize, the disclosed embodiments may be modified in various different ways, all without departing from the spirit or scope of this disclosure.

It will be understood that when an element such as a layer, film, or substrate is referred to as being "on" another element, it may be directly on the other element or intervening elements may also be present. It will be understood that when an element such as a layer, film, or substrate is referred to as being "between" another element, it may be directly adjacent to the other element or intervening elements may also be present.

As used herein, unless otherwise provided, the term "alkyl" refers to a $C_1$ to $C_{30}$ alkyl, for example a $C_1$ to $C_{15}$ alkyl or a $C_1$ to $C_{10}$ alkyl, the term "alkenyl" refers to a $C_2$ to $C_{30}$ alkenyl, for example a $C_2$ to $C_{15}$ alkenyl or a $C_2$ to $C_{10}$ alkenyl, and the term "alkynyl" refers to a $C_2$ to $C_{30}$ alkynyl, for example a $C_2$ to $C_{15}$ alkynyl or a $C_2$ to $C_{10}$ alkynyl, the term "cycloalkyl" refers to a $C_3$ to $C_{30}$ cycloalkyl, for example a $C_3$ to $C_{15}$ cycloalkyl or a $C_3$ to $C_{10}$ cycloalkyl, the term "cycloalkenyl" refers to a $C_3$ to $C_{30}$ cycloalkenyl, for example a $C_3$ to $C_{15}$ cycloalkenyl or a $C_3$ to $C_{10}$ cycloalkenyl, the term "cycloalkynyl" refers to a $C_5$ to $C_{30}$ cycloalkynyl, for example a $C_5$ to $C_{15}$ cycloalkynyl or a $C_5$ to $C_{10}$ cycloalkynyl, the term "alkylene" refers to a $C_1$ to $C_{30}$ alkylene, for example a $C_1$ to $C_{15}$ alkylene or a $C_1$ to $C_{10}$ alkylene, the term "alkenylene" refers to a $C_2$ to $C_{30}$ alkenylene, for example a $C_2$ to $C_{15}$ alkenylene or a $C_2$ to $C_{10}$ alkenylene, the term "alkynylene" refers to a $C_2$ to $C_{30}$ alkynylene, for example a $C_2$ to $C_{15}$ alkynylene or a $C_2$ to $C_{10}$ alkynylene, the term "alkoxy" refers to a $C_1$ to $C_{30}$ alkoxy, for example a $C_1$ to $C_{15}$ alkoxy or a $C_1$ to $C_{10}$ alkoxy, the term "carbonyl" refers to a $C_1$ to $C_{30}$ carbonyl, for example a $C_1$ to $C_{15}$ carbonyl or a $C_1$ to $C_{10}$ carbonyl, the term "carboxyl" refers to a $C_1$ to $C_{30}$ carboxyl, for example a $C_1$ to $C_{15}$ carboxyl or a $C_1$ to $C_{10}$ carboxyl, the term "(meth)acrylate" refers to a $C_2$ to $C_{30}$ (meth)acrylate, for example a $C_2$ to $C_{15}$ (meth)acrylate or a $C_2$ to $C_{10}$ (meth)acrylate, the term "epoxy" refers to a $C_2$ to $C_{30}$ epoxy, for example a $C_3$ to $C_{15}$ epoxy or a $C_3$ to $010$ epoxy, the term "thiol" refers to —SH and a thiol including a $C_1$ to $C_{10}$ alkyl, for example —SH and a thiol including a $C_1$ to $C_s$ alkyl, the term "hydroxyl" refers to —OH and a hydroxyl including a $C_1$ to $C_{10}$ alkyl, for example —OH and a hydroxyl including a $C_1$ to $C_s$ alkyl, the term "amine" refers to —NH$_2$ and an amine including a $C_1$ to $C_{10}$ alkyl, for example —NH$_2$ and an amine including a $C_1$ to $C_s$ alkyl, the term "nitro" refers to —NO$_2$ and a nitro including a $C_1$ to $C_{10}$ alkyl, for example —NO$_2$ and a nitro including a $C_1$ to $C_5$ alkyl, the term "cyano" refers to —CN and a cyano including a $C_1$ to $C_{10}$ alkyl, for example —CN and a cyano including a $C_1$ to $C_5$ alkyl, the term "halogen" refers to F, Cl, Br, and I, the term "aromatic group" refers to a $C_6$ to $C_{30}$ aryl, for example a $C_6$ to $C_{20}$ aryl or a $C_6$ to $C_{10}$ aryl, and the term "heterocyclic group" refers to a $C_3$ to $C_{30}$ heteroaryl, a $C_3$ to $C_{30}$ heterocycloalkyl, a $C_3$ to $C_{30}$ heterocycloalkenyl, or a $C_3$ to $C_{30}$ heterocycloalkynyl, wherein the term "hetero" refers to a compound including a heteroatom selected from the group consisting of N, O, S, Si, and P, and 1 to 3 heteroatoms may be present in one ring. As used herein, (meth)acrylate refers to a compound having either an acrylate or a methacrylate group.

As used herein, when a definition is not otherwise provided, the term "substituted" refers to a compound or group substituted with a substituent selected from the group consisting of a halogen, such as F, Br, Cl or I, a hydroxy, a thiol, a nitro, a cyano, an amino, an amidino, a hydrazine, a hydrazone, a carboxyl, a substituted or unsubstituted alkoxy, a substituted or unsubstituted thioether, such as SR$_{10}$, wherein R$_{10}$ is a $C_1$ to $C_{10}$ alkyl, a substituted or unsubstituted sulfone, such as SO$_2$R$_{11}$, wherein R$_{11}$ is a $C_1$ to $C_{10}$ alkyl, a substituted or unsubstituted alkyl, a substituted or unsubstituted alkenyl, a substituted or unsubstituted alkynyl, a substituted or unsubstituted cycloalkyl, a substituted or unsubstituted cycloalkenyl, a substituted or unsubstituted cycloalkynyl, a substituted or unsubstituted aryl, and a substituted or unsubstituted heterocyclic group, instead of at least one hydrogen of the designated compound or group.

As used herein an asterisk (i.e., "*") denotes a point of attachment, e.g., a position linked to the same or different atom or chemical formula.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting. As used herein, the terms "a" and "an" are open terms that may be used in conjunction with singular items or with plural items. Thus as used herein, the singular forms "a," "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

An optoelectronic device according to an embodiment includes: a first electrode; an active layer positioned (e.g., disposed) on the first electrode; a second electrode positioned (e.g., disposed) on the active layer; and a self-assembled monolayer ("SAM") interposed (e.g., positioned) between the first electrode and the active layer, interposed between the active layer and the second electrode, or disposed inside the active layer. The self-assembled monolayer includes a first compound and a second compound, which have different functional groups than each other.

Hereinafter, referring to FIGS. 1 to 3, a solar cell of an optoelectronic device according to an embodiment is described.

FIG. 1 is a schematic cross-sectional view of an embodiment of a solar cell 10 according to an embodiment.

Referring to FIG. 1, the solar cell 10 includes a substrate 1, a cathode 5, a photoactive layer 11, and an anode 3. The photoactive layer 11 includes an n-type semiconductor layer 9, a self-assembled monolayer 13, and a p-type semiconductor layer 7. The self-assembled monolayer 13 includes compounds having different functional groups than each other. The self-assembled monolayer 13 includes a first compound 2 and a second compound 4, which have different functional groups than each other.

Although the exemplary solar cell 10 shown in FIG. 1 is illustrated as having a structure in which a cathode 5 contacts a substrate 1, it is not limited thereto. The anode 3 may contact the substrate 1, or the position of the n-type semiconductor layer 9 and the p-type semiconductor layer 7 may be different.

The substrate 1 may include a transparent material such as glass, polycarbonate, polymethylmethacrylate, polyethyleneterephthalate, polyimide, polyethersulfone ("PES"), or the like, or a combination thereof.

The cathode 5 is a transparent electrode and may including ZnO, indium tin oxide ("ITO"), $SnO_2$, $In_2O_3$—ZnO ("IZO"), aluminum doped ZnO ("AZO"), gallium doped ZnO ("GZO"), or the like, or a combination thereof.

The anode 3 may include a metal, a metal alloy, a semimetal, a light transmitting transparent oxide, or the like, or a combination thereof. Examples of the metal may include: an alkali metal such as lithium (Li), sodium (Na), or the like; an alkaline-earth metal such as beryllium (Be), magnesium (Mg), or the like; aluminum (Al); transition elements such as silver (Ag), gold (Au), cobalt (Co), iridium (Ir), nickel (Ni), osmium (Os), palladium (Pd), platinum (Pt), or the like; a rare earth element; or a semi-metal such as selenium (Se), or the like, or a combination thereof. The metal alloy may include a sodium-potassium alloy, a magnesium-indium alloy, an aluminum-lithium alloy, or the like or a combination thereof. In addition, the anode 3 may include a laminate including a first layer comprising the metal or the metal alloy, and a second layer comprising the oxide or a halide of a metal. For example, the laminate may include an electrode comprising $MoO_3$/Ag, $Al_2O_3$/Al, or the like, or a combination thereof. The light transmitting transparent oxide may include ZnO, ITO, $SnO_2$, IZO, AZO, GZO, or the like, or a combination thereof, including the materials mentioned above for the cathode 5.

The photoactive layer 11 includes a n-type semiconductor layer 9, a self-assembled monolayer 13, and a p-type semiconductor layer 7.

The p-type semiconductor layer 7 includes a p-type semiconductor, such as a conductive polymer compound, a conductive low molecular weight between 100 g/mol and 1,000 g/mol compound, or the like, or a combination thereof. Examples thereof include polyaniline, polypyrrole, polythiophene, poly(p-phenylene-vinylene), poly(2-methoxy-5-(2'-ethyl-hexyloxy)-1,4-phenylene-vinylene) ("MEH-PPV"), poly(2-methoxy-5-(3,7-dimethyloctyloxy)-1,4-phenylene-vinylene) ("MDMO-PPV"), pentacene, a phthalocyanine, poly(3,4-ethylenedioxythiophene) ("PEDOT"), a poly(3-alkylthiophene) such as poly(3-hexylthiophene) ("P3HT"), or the like, or a combination thereof.

The n-type semiconductor layer 9 includes an n-type semiconductor. The n-type semiconductor may include: a fullerene, such as a fullerene having a large electron affinity, such as C60, C70, C74, C76, C78, C82, C84, C720, C860, or the like, or a combination thereof; a fullerene derivative, such as 1-(3-methoxy-carbonyl)propyl-1-phenyl-(6,6)C61 ("PCBM"), C71-PCBM, C84-PCBM, bis-PCBM, or the like, or a combination thereof; perylene; an inorganic semiconductor such as CdS, CdTe, CdSe, ZnO, or the like; or a mixture thereof.

Photoradiation of the photoactive layer produces an exciton, including an electron and a hole from a p-type semiconductor layer. The exciton may be separated into an electron and a hole at the interface of the p-type semiconductor layer and the n-type semiconductor layer due to an electron affinity difference of the p-type semiconductor layer and the n-type semiconductor layer. While not wanting to be bound by theory, it is understood that the energy difference at the interface between the energy level of the lowest unoccupied molecular orbital ("LUMO") of the p-type semi-conductor and the work function (or LUMO energy level) of the n-type semiconductor leads to dissociation of the exciton, and also to energy losses. The separated electron moves to a cathode through the n-type semiconductor layer, and the hole moves to an anode through the p-type semiconductor layer due to a built-in (e.g., intrinsic) electric field. Charge transfer and energy loss are determined by the differences between the work function of the anode and the energy level of the highest occupied molecular orbital ("HOMO") of the p-type semiconductor layer, or between the work function of the cathode and the work function (or LUMO energy level) of the n-type semiconductor. If work function levels are not selected in the cell, a decrease in open-circuit voltage ("$V_{oc}$") or a decrease in photocurrent density may occur, resulting in a decrease in power efficiency.

Accordingly, the work function at the interface is controlled by forming (e.g., disposing) the self-assembled monolayer, which includes the first compound and the second compound having different functional groups from each other and are disposed in at least one of layers of an exemplary solar cell, and by selecting the ratio (e.g., content) of the first compound and the second compound. Thereby it is possible to increase the open circuit voltage ("$V_{oc}$") and amount of photoelectric current, improving the photoelectric conversion efficiency.

The self-assembled monolayer may include a plurality of compounds, specifically at least three kinds of compounds, which have different functional groups from one another, as well as at least two kinds of compounds having different functional groups from each other.

Referring to FIG. 1, the self-assembled monolayer 13 is positioned (e.g., disposed) between the n-type semiconductor layer 9 and the p-type semiconductor layer 7, and includes a first compound 2 and a second compound 4 having different functional groups from each other.

The first compound 2 may have the following Chemical Formula 1, and the second compound 4 may have the following Chemical Formula 2.

   Chemical Formula 1

   Chemical Formula 2

In the above Chemical Formulas 1 and 2, $A_1$ and $A_2$ are the same or different, and are independently selected from the group consisting of a thiol derivative, an alcohol derivative, an alkoxysilane derivative, a halosilane derivative, a carboxylic acid derivative, and a combination thereof. In an embodiment, $A_1$ and $A_2$ include at least one selected from the group consisting of O, S, Si, and a combination thereof.

In an embodiment, $A_1$ and $A_2$ act as anchoring group for the self-assembled monolayer.

In the above Chemical Formulas 1 and 2, $B_1$ and $B_2$ are the same or different, and are independently selected from the group consisting of a single bond, a substituted or unsubstituted $C_1$ to $C_{30}$ alkylene, a substituted or unsubstituted $C_1$ to $C_{30}$ alkenylene, a substituted or unsubstituted $C_1$ to $C_{30}$ alkynylene, a derivative thereof, and a combination thereof.

In an embodiment $B_1$ and $B_2$ act as linkers to connect the anchoring groups $A_1$ and $A_2$ with the functional group $X_1$ and $X_2$, respectively, in which $X_1$ and $X_2$.

In the above Chemical Formulas 1 and 2, $X_1$ and $X_2$ are different functional groups from each other, and are independently selected from the group consisting of hydrogen, a substituted or unsubstituted $C_1$ to $C_{30}$ alkyl, a substituted or unsubstituted $C_2$ to $C_{30}$ alkenyl, a substituted or unsubstituted $C_2$ to $C_{30}$ alkynyl, a substituted or unsubstituted $C_3$ to $C_{30}$ cycloalkyl, a substituted or unsubstituted $C_3$ to $C_{30}$ cycloalkenyl, a substituted or unsubstituted $C_5$ to $C_{30}$ cycloalkynyl, a substituted or unsubstituted $C_1$ to $C_{30}$ alkoxy, a substituted or unsubstituted $C_1$ to $C_{30}$ carbonyl, a substituted or unsubstituted $C_1$ to $C_{30}$ carboxyl, a substituted or unsubstituted $C_2$ to $C_{30}$ (meth)acrylate, a substituted or unsubstituted $C_2$ to $C_{30}$ epoxy, a substituted or unsubstituted $C_6$ to $C_{30}$ aromatic group, a substituted or unsubstituted $C_3$ to $C_{30}$ heterocyclic group, a thiol, a hydroxy, an amine, a nitro, a cyano, a halogen, a derivative thereof, and the like, and a combination thereof.

For example, in one embodiment, $X_1$ and $X_2$ are different functional groups from each other, and are independently selected from the group consisting of n-octyl, acetoxy, acetyl, acryloxyethoxy, acryloxy, allylamino, allyl, allyloxy, amino, γ-aminopropyl, benzyl, benzyloxy, carbomethoxy, cyano, cyclopentadienyl, cyclopentyl, glycidoxy, methacryloxy, imidazole, methoxyphenyl, methylamino, methylpropenyl, naphthyl, phenyl, phenoxy, phenylacetoxy, phenylamino, pyridine, pyrrole, tolyl, thiol, vinyl, fluoro, trifluoromethyl, pentafluoroethyl, tridecafluorohexyl, heptadecafluorooctyl, heptadecafluoro-1,1,2,2-tetrahydrodecyl, chloro, bromo, bromophenyl, bromovinyl, iodo, a derivative thereof, and the like, and a combination thereof.

As used herein, a "functional group" is a group that imparts a selected property to the self-assembled monolayer. Thus, $X_1$ and $X_2$ are functional groups that affect the physical properties of compounds, including characteristics such as hydrophobic, hydrophilic, electron donating, or electron withdrawing properties. Therefore, it is possible to independently control the work function and the surface energy of the self-assembled monolayer.

In an embodiment, at least one of $X_1$ and $X_2$ may be a hydrophilic functional group, and for example may be a functional group selected from the group consisting of an amine, a carboxyl, an epoxy, a thiol, a (meth)acrylate, a hydroxyl, a derivative thereof, and the like, and a combination thereof. The compound including the hydrophilic functional group may have a surface energy of about 40 to about 100 millinewtons per meter ("mN/m"), specifically about 40 to about 70 mN/m, more specifically about 50 to about 60 mN/m.

In another embodiment, at least one of $X_1$ and $X_2$ may be a hydrophobic functional group, and for example may be selected from the group consisting of —$CH_3$, a fluorinated derivative such as —$CF_3$, a derivative thereof, and the like, and a combination thereof. The compound including a hydrophobic functional group may have surface energy of about 1 to about 39 mN/m, specifically about 20 to about 35 mN/m, more specifically about 20 to about 30 mN/m.

In an embodiment, at least one of $X_1$ and $X_2$ may be an electron donating functional group, and for example may be a functional group selected from the group consisting of —NH$_2$, —OCH$_3$, —CH$_3$, a derivative thereof, and the like, and a combination thereof. When a compound includes the electron-donating functional group, the dipole moment direction of the self-assembled monolayer may be directed toward the functional group (X$_1$ and X$_2$), reducing the work function of a material treated with the self-assembled monolayer.

The relationship between the dipole moment ("μ") and the work function change ("ΔV") of the substrate at the interface may be represented by the following Equation 1.

$$\Delta V = (N \cdot \mu \cdot \cos \theta)/(\in_r \cdot \in_0) \quad \text{Equation 1}$$

In Equation 1, N is the number of dipole moments (and may have the units inverse square centimeters, "cm$^{-2}$"); e is the angle between the dipole moment and the interface vertical direction; $\in_r$ is a dielectric constant; and $\in_0$ is a vacuum dielectric constant (e.g. permittivity of vacuum).

In an embodiment, X$_1$ and X$_2$ may be electron withdrawing functional groups, for example, and may be a functional group selected from the group consisting of NO$_2$, CN, F, Br, a derivative thereof, and the like, and a combination thereof. When it includes the electron-withdrawing group, the direction of the dipole moment of the self-assembled monolayer may be directed toward the anchoring group (A$_1$ and A$_2$), thus increasing the work function of a layer treated with the self-assembled monolayer.

The first compound 2 and the second compound 4 having different functional groups from each other may be included in a selected mole ratio to provide desirable physical properties.

In order to provide the self-assembled monolayer 13 with the first compound 2 and the second compound 4 having different functional groups from each other in a selected mole ratio, each self-assembled monolayer precursor compound is prepared in the selected mole ratio. The prepared self-assembled monolayer precursor compounds are mixed and disposed (e.g., deposited or coated), or each self-assembled monolayer precursor compound is sequentially disposed (e.g., deposited or coated). In addition, a portion of the self-assembled monolayer precursor compounds may be mixed and disposed (e.g., deposited or coated), and the remaining portion or portions of the self-assembled monolayer precursor compounds may be disposed (e.g., deposited or coated) individually.

The disposing (e.g., depositing or coating) may be performed by a method including wet coating, such as spin coating, dip coating, spray coating, or the like, or by gas deposition, but the method is not limited thereto.

The self-assembled monolayer precursor compound may have a structure represented by the following Chemical Formula 3.

A$_3$-B$_3$-X$_3$  Chemical Formula 3

In the above Chemical Formula 3, B$_3$ is the same as B$_1$ and B$_2$ of the above Chemical Formulas 1 and 2, X$_3$ is the same as X$_1$ and X$_2$ of the above Chemical Formulas 1 and 2, and A$_3$ is selected from the group consisting of a thiol, a hydroxy, an alkoxysilane, a halosilane, a carboxyl, and the like, and a combination thereof, for example SH, Si(OCH$_3$)$_3$, Si(OCH$_2$CH$_3$)$_3$, SiCl$_3$, COOH, and the like.

Examples of the compounds represented by the above Chemical Formula 3 include γ-aminopropyl trimethoxysilane, γ-aminopropyl triethoxysilane, n-octyl trimethoxysilane, n-octyl triethoxysilane, (heptadecafluoro-1,1,2,2-tetrahydrodecyl) trimethoxysilane, (heptadecafluoro-1,1,2,2-tetrahydrodecyl) triethoxysilane, benzyl trimethoxysilane, benzyl triethoxysilane, and the like.

FIG. 1 shows one embodiment of the optoelectronic disclosed herein. The self-assembled monolayer may be interposed between the cathode 5 and the n-type semiconductor layer 9, interposed between the n-type semiconductor layer 9 and the p-type semiconductor layer 7, or interposed between the p-type semiconductor layer 7 and the anode 3. Other configurations (not shown) are possible.

The first compound 2, represented by Chemical Formula 1 and the second compound (4) represented by Chemical Formula 2 having different functional groups from each other may have independently a dipole moment of about −10 debye (D) to about 10 D, for example, specifically a dipole moment of about −5 D to about 5 D, more specifically about −3 D to about 3 D. The dipole moment is in a direction from the anchoring group towards the functional group (decreasing the work function at the interface), or in a direction from the functional group towards the anchoring group (increasing the work function at the interface).

The first compound 2 represented by Chemical Formula 1 or the second compound 4 represented by Chemical Formula 2 having different functional groups from each other may be mixed in a selected ratio to form a self-assembled monolayer 13, to control the dipole moment of the self-assembled monolayer 13. Accordingly, the work function is effectively controlled at the interface, and the transport of electrons and holes may be easily improved or decreased. Accordingly, it is possible to increase the open circuit voltage and the amount of photoelectric current amount of the solar cell and improve the photoelectric conversion efficiency.

The optoelectronic device may further include a hole blocking film (not shown) between the n-type semiconductor layer 9 and the cathode 5 or an electron blocking film (not shown) between the p-type semiconductor layer 7 and the anode 3. In an embodiment, the self-assembled monolayer is selectively positioned between the hole blocking film and the n-type semiconductor layer, between the p-type semiconductor layer and the electron blocking film, between the hole blocking film and the n-type semiconductor layer, or between the p-type semiconductor layer and the electron blocking film.

Figure 2:
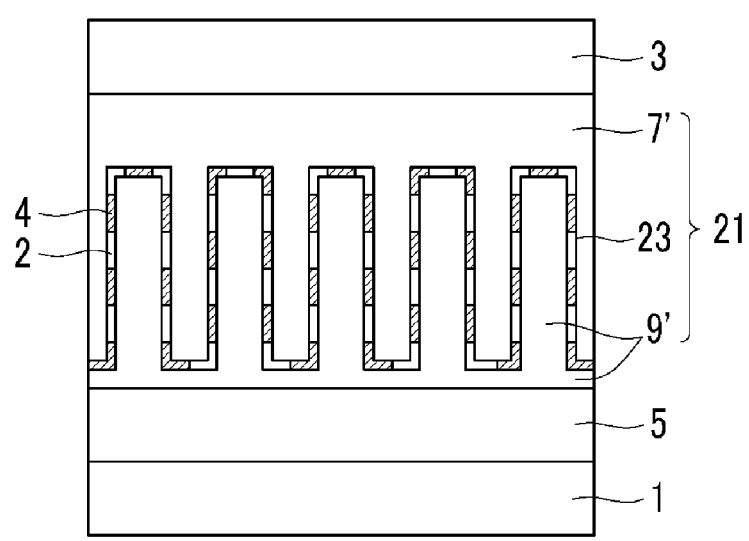
FIG. 2 is a schematic cross-sectional view of an exemplary embodiment of a solar cell.

FIG. 2 is a schematic cross-sectional view of another exemplary embodiment of the solar cell 20.

Referring to FIG. 2, a solar cell 20 includes a substrate 1, a cathode 5, a photoactive layer 21, and an anode 3. The photoactive layer 21 includes an n-type semiconductor layer 9', a self-assembled monolayer 23, and a p-type semiconductor layer 7'. Unless stated otherwise, the substrate, the cathode, the n-type semiconductor layer, the p-type semiconductor layer, the anode, and the self-assembled monolayer are the same as in the above.

Although FIG. 2 shows the structure of the solar cell 20 in which the substrate 1 contacts the cathode 5, it is not limited thereto. The anode 3 may contact the substrate 1, or the position of the n-type semiconductor layer 9' and the p-type semiconductor layer 7' may be different.

The n-type semiconductor layer 9' is disposed (e.g., formed) with a fine pattern. The electron separated from the exciton, which is an electron-hole pair, is moved through the fine pattern, so the time for the electron to reach the cathode 5 is reduced, decreasing the possibility of recombination of the separated electron with the hole. Thereby, the amount of photoelectric current is increased, improving the photoelectric efficiency. The fine pattern may be disposed (e.g., formed) on the p-type semiconductor layer 7'.

In addition, a self-assembled monolayer 23, which includes the first compound 2 and the second compound 4, which have different functional groups than each other, may be disposed (e.g., formed) on the surface of the n-type semiconductor layer 9', which has a the fine pattern. Before disposing (e.g., forming) the p-type semiconductor layer 7', the fine pattern is disposed (e.g., formed) on the surface of the n-type semiconductor layer 9', the self-assembled monolayer 23, which includes the first compound 2 and the second compound 4, which have different functional groups than each other and are contained in a selected ratio, and have independently a selected physical property, such as being hydrophilic or hydrophobic, may be disposed (e.g., formed) on the surface of the fine pattern. In an embodiment, the wetting properties on the surface of the n-type semiconductor layer 9' are improved, thus the p-type semiconductor may be easily coated on all the corners of the fine pattern of the n-type semiconductor layer 9'. In addition, the work function is controlled at the interface to improve the efficiency of the solar cell.

The compound is applicable to the bulk heterojunction ("BHJ") solar cell. For example, the cathode may be disposed (e.g., formed) on the substrate and contacted with a nanostructure to be vertically aligned, and then a self-assembled monolayer may be disposed on the surface of the nanostructure, the self-assembled monolayer including the first compound and the second compound, which have different functional groups than each other and contained in a selected ratio, and have independently a selected physical property, such as being hydrophilic or hydrophobic. In an embodiment, it is possible to easily coat the mixture of the n-type semiconductor material and the p-type semiconductor material on all corners of the nanostructure. In addition, the work function may be controlled at the interface to improve the efficiency of the solar cell. The nanostructure may be disposed (e.g., formed) on a side of the device corresponding to an anode.

The nanostructure may include a semiconductor element, a semiconductor compound, a semiconductor carbon material, and the like, but is not limited thereto. The nanostructure may have a one-dimensional linear structure, a two-dimensional flat structure, or a three-dimensional cubic structure. The nanostructure may have various shapes, such as nanotube, nanorod, nanowire, nanotree, nanotetrapod, nanodisk, nanoplate, nanoribbon, and the like.

The surface energy of the self-assembled monolayer is controlled by disposing (e.g., forming) the self-assembled monolayer, which includes the first compound represented by Chemical Formula 1 and the second compound represented by Chemical Formula 2, which have different functional groups than each other and are contained in a selected ratio to control the physical properties of the self-assembled monolayer, thus controlling whether the self-assembled monolayer is hydrophobic or hydrophilic. Accordingly, the compound may easily provide a solar cell having excellent efficiency by using the self-assembled monolayer.

Although FIG. 2 shows only an exemplary embodiment wherein the self-assembled monolayer is disposed between the p-type semiconductor layer 7' and the n-type semiconductor layer 9', the self-assembled monolayer may be interposed between the cathode 5 and the n-type semiconductor layer 9', interposed between the n-type semiconductor layer 9' and the p-type semiconductor layer 7', or interposed between the p-type semiconductor layer 7' and the anode 3.

Figure 3:
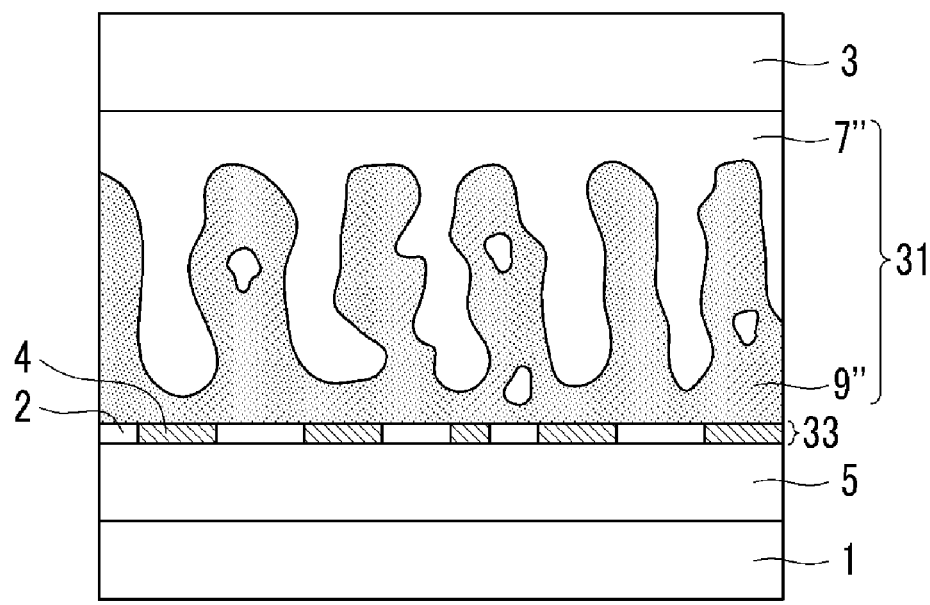
FIG. 3 is a schematic cross-sectional view of an exemplary embodiment of a solar cell.

FIG. 3 is a schematic cross-sectional view of an exemplary embodiment of a solar cell 30.

Referring to FIG. 3, the solar cell 30 is a BHJ solar cell type that includes a substrate 1, a cathode 5, a self-assembled monolayer 33, a photoactive layer 31, and an anode 3. The self-assembled monolayer 33 may include a first compound 2 and a second compound 4, which have different functional groups than each other. Unless stated otherwise, the substrate, the cathode, the n-type semiconductor, the p-type semiconductor, the anode, and the self-assembled monolayer are the same as disclosed above.

Although FIG. 3 shows the structure of the solar cell 30 in which the substrate 1 contacts the cathode 5, it is not limited thereto. The anode 3 may contact the substrate 1, or the position of an n-type semiconductor layer 9" and a p-type semiconductor layer 7" may be different.

Before forming the photoactive layer 31, the self-assembled monolayer 33, which includes the first compound 2 and the second compound 4, which have different functional groups than each other and are contained in a selected ratio, and have independently selected physical properties, such as hydrophilic or hydrophobic properties, may be formed on the surface of the cathode 5. In an embodiment, the morphology of the photoactive layer 31, disposed (e.g., formed) by coating a mixture of the n-type semiconductor material and the p-type semiconductor material, is controlled by selecting the physical properties of the self-assembled monolayer 33. Accordingly, the photoactive layer 31 may be further uniformly disposed (e.g., formed). Accordingly, the contact surface area between the n-type semiconductor 9" and the p-type semiconductor 7" may be extended, a distance that electrons and holes transport may be reduced, and the amount of photoelectric current provided by the solar cell is increased, improving the photoelectric conversion efficiency.

Although FIG. 3 shows an embodiment wherein the self-assembled monolayer is positioned between the cathode 5 and the photoactive layer 31, the self-assembled monolayer may be interposed between the cathode 5 and the photoactive layer 31 or interposed between the photoactive layer 31 and the anode 3.

Hereinafter, an organic light-emitting device ("OLED") is disclosed as an optoelectronic diode according to an exemplary embodiment with reference to FIG. 4.

Figure 4:
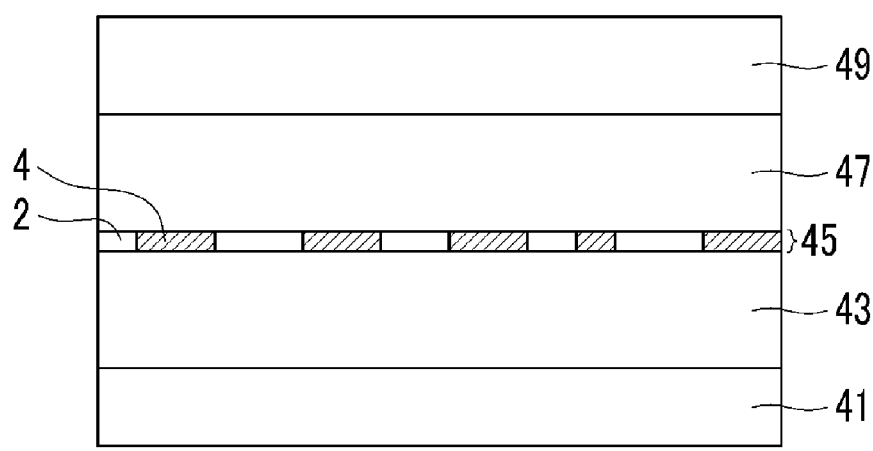
FIG. 4 is a schematic cross-sectional view of an exemplary embodiment of an organic light emitting diode ("OLED")

FIG. 4 is a schematic cross-sectional view of an exemplary embodiment of an OLED 40 according to an embodiment.

Referring to FIG. 4, the OLED 40 includes a substrate 41, an anode 43, a self-assembled monolayer 45, an emission layer 47, and a cathode 49. The self-assembled monolayer 45 may include the first compound 2 and the second compound 4, which have different functional groups than each other. Hereinafter, unless stated otherwise, the substrate and the self-assembled monolayer are the same as disclosed above.

Although FIG. 4 shows the structure of the OLED 40 in which the substrate 41 contacts the anode 43, it is not limited thereto. The cathode 49 may contact the substrate 41.

The anode 43 is a light transmitting transparent electrode and may include ZnO, indium tin oxide ("ITO"), $SnO_2$, $In_2O_3$—ZnO ("IZO"), aluminum doped ZnO ("AZO"), gallium doped ZnO ("GZO"), or the like, or a combination thereof.

The cathode 49 may comprise a metal, a metal alloy, a semi-metal, a light transmitting transparent oxide, or the like, or a combination thereof. Examples of the metal may include an alkali metal, such as lithium (Li), sodium (Na), or the like; an alkaline-earth metal such as beryllium (Be), magnesium (Mg), or the like; aluminum (Al); transition elements such as silver (Ag), gold (Au), cobalt (Co), iridium (Ir), nickel (Ni), osmium (Os), palladium (Pd), platinum (Pt), or the like; a rare earth element; and a semi-metal such as selenium (Se), or the like, or a combination thereof. Examples of the metal alloy may include a sodium-potassium alloy, a magnesium-indium alloy, an aluminum-lithium alloy, or the like or a combination thereof. In addition, the cathode 49 may include a laminate including a first layer comprising the metal or the metal alloy, and a second layer comprising the oxide or a halide of a metal. For example, the cathode may include an electrode such as $MoO_3/Ag$, $Al_2O_3/Al$, or the like. The light transmitting transparent oxide may include ZnO, ITO, $SnO_2$, IZO, AZO, GZO, or the like, or a combination thereof, which are also mentioned as materials for the anode 43.

The emission layer 47 may include a low molecular weight between 200 g/mol and 1000 g/mol, specifically 500 g/mol or a polymer material known for use as a light-emitting layer in the art. Examples of the low molecular weight material include an anthracene-based compound, tris-(8-hydroxy quinoline)aluminum ("$Alq_3$"), N,N'-diphenyl-N,N'-bis[3-methyl phenyl]-1,1'-biphenyl-4,4'-diamine ("TPD"), or the like, or a combination thereof. In addition, the polymer material may include a polymer host doped with a low molecular weight dopant. Examples of the host may include poly(vinylcarbazole), poly(9,9-dioctylfluorene), or the like; or a combination thereof, and examples of the low molecular weight dopant may include tris(9,9-dihexyl-2-(pyridinyl-2')fluorene)iridium(III) ("$Ir(dpf)_3$"), platinum(II) porphyrins ("PtOEP"), iridium(III)bis(1-phenylisoquinolyl)-N,C)acetylacetonate ("$(piq)_2Ir(acac)$"), or the like, or a combination thereof.

The emission layer 47 may be disposed (e.g., formed) by a known method of forming the emission layer, for example by thermo-deposition, laser transmitting, spin coating, inkjet printing, or the like.

Before forming the emission layer 47, the self-assembled monolayer 45, which includes a first compound 2 and a second compound 4, which have different functional groups than each other in a selected ratio and have independently a selected physical property, such as electron donating or electron accepting properties, may be disposed (e.g., formed) on the anode 43, and thereby the dipole moment of the self-assembled monolayer 45 is controlled. Accordingly, the work function at the interface between the anode 43 and the emission layer 47 is effectively controlled, and it is possible to easily transmit or suppress electrons and holes. Accordingly, the amount of transmitted and the amount of recombined electrons and holes in the OLED are increased to improve the luminous efficiency.

Although not shown in FIG. 4, the self-assembled monolayer may be disposed (e.g., formed) between at least one of the anode 43 and the emission layer 47, and the emission layer 47 and the cathode 49.

The following examples illustrate this disclosure in further detail. The disclosed exemplary embodiments shall not be limiting.

EXAMPLES

Example 1

Self-Assembled Monolayer Fabrication

An ITO electrode is formed on a glass substrate, and an n-type semiconductor of ZnO is coated on the ITO electrode to provide a ZnO semiconductor layer.

In a glove box, a mixture of γ-aminopropyl triethoxysilane and n-octyl trimethoxysilane is added into toluene in an amount shown in the following Table 1 and agitated to provide a self-assembled monolayer precursor solution having a concentration of 5 millimolar (mM). In Table 1, milliliters are abbreviated "ml."

TABLE 1

| Mole Ratio (γ-aminopropyl triethoxysilane: n-octyl trimethoxysilane) | γ-aminopropyl triethoxysilane (ml) | n-octyl trimethoxysilane (ml) | toluene (ml) |
| --- | --- | --- | --- |
| 1:0 | 0.03 | 0 | 20 |
| 3:1 | 0.022 | 0.01 | 20 |
| 1:3 | 0.0075 | 0.03 | 20 |
| 0:1 | 0 | 0.04 | 20 |

The glass substrate formed with the ZnO semiconductor layer is immersed in the self-assembled monolayer precursor solution at room temperature for one hour to provide a self-assembled monolayer on the semiconductor layer.

The γ-aminopropyl triethoxysilane has a dipole moment of −2.96 D and surface energy of 58 mN/m, thus is hydrophilic. The n-octyl trimethoxysilane has a dipole moment of −2.5 D and surface energy of 30 mN/m, thus is hydrophobic.

Example 2

Self-Assembled Monolayer Fabrication

A self-assembled monolayer is prepared in accordance with the same procedure as in Example 1, except that n-octyl trimethoxysilane and (heptadecafluoro-1,1,2,2-tetrahydrodecyl) triethoxysilane are used instead of γ-aminopropyl trimethoxysilane and n-octyl trimethoxysilane.

The (heptadecafluoro-1,1,2,2-tetrahydrodecyl) triethoxysilane has a dipole moment of 1.5 D and surface energy of 18 mN/m, thus is hydrophobic.

Example 3

Self-Assembled Monolayer Fabrication

A self-assembled monolayer is prepared in accordance with the same procedure as in Example 1, except that (heptadecafluoro-1,1,2,2-tetrahydrodecyl) triethoxysilane is used instead of n-octyl trimethoxysilane.

Example 4

Preparation of a Photoactive Layer for a Bulk Heterojunction ("BHJ") Solar Cell

An ITO electrode is formed on a glass substrate, and an n-type semiconductor of ZnO is coated on the ITO electrode to provide a ZnO semiconductor layer.

In a glove box, a mixture of 0.022 ml of γ-aminopropyl triethoxysilane and 0.01 ml of n-octyl trimethoxysilane in a mole ratio of 3:1 is added into 20 ml of toluene and agitated to provide a self-assembled monolayer precursor solution having a concentration of 5 mM.

The glass substrate formed with the ZnO semiconductor layer is immersed in the self-assembled monolayer precursor solution at room temperature for one hour to provide a self-assembled monolayer on the ZnO semiconductor layer.

A 30 milligram (mg) quantity of a mixture of poly(3-hexylthiophene) ("P3HT") and 1-(3-methoxy-carbonyl)propyl-1-phenyl(6,6)C61 ("PCBM") in a weight ratio of 1:1 is added into 1 ml of chlorobenzene and agitated to provide a blend. The blend is coated on the obtained self-assembled monolayer and dried. Thereby, a photoactive layer of a BHJ solar cell is provided.

Example 5

BHJ Solar Cell Fabrication

An ITO electrode is formed on a glass substrate, and an n-type semiconductor of ZnO is grown on the ITO electrode to provide a ZnO semiconductor layer.

In a glove box, a mixture of 0.022 ml of γ-aminopropyl triethoxysilane and 0.01 ml of n-octyl trimethoxysilane in a mole ratio of 3:1 is added to 20 ml of toluene and agitated to provide a self-assembled monolayer precursor solution having a mole concentration of 5 mM.

The glass substrate formed with the ZnO semiconductor layer is immersed in the self-assembled monolayer precursor solution at room temperature for one hour to provide a self-assembled monolayer on the ZnO semiconductor layer.

A 30 ml quantity of a mixture of poly(3-hexylthiophene) ("P3HT") and 1-(3-methoxy-carbonyl)propyl-1-phenyl(6,6) C61 ("PCBM") in a weight ratio of 1:1 is added to 1 ml of chlorobenzene and agitated to provide a blend. The blend is coated on the obtained self-assembled monolayer and annealed to provide a photoactive layer.

A $MoO_3$/Au electrode is formed on the obtained photoactive layer. Thereby, a BHJ solar cell is provided.

Comparative Example 1

Preparation of a Photoactive Layer of a BHJ Solar Cell

An ITO electrode is formed on a glass substrate, and an n-type semiconductor of ZnO is coated on the ITO electrode to provide a ZnO semiconductor layer.

In a glove box, 0.03 ml of γ-aminopropyl triethoxysilane is added to 20 ml of toluene and agitated to provide a self-assembled monolayer precursor solution having a mole concentration of 5 mM.

The glass substrate formed with the ZnO semiconductor layer is immersed in the self-assembled monolayer precursor solution at room temperature for one hour to provide a self-assembled monolayer on the semiconductor layer.

A 30 ml quantity of a mixture of poly(3-hexylthiophene) ("P3HT") and 1-(3-methoxy-carbonyl)propyl-1-phenyl(6,6) C61 ("PCBM") in a weight ratio of 1:1 is added to 1 ml of chlorobenzene and mixed to provide a blend. The blend is coated on the obtained self-assembled monolayer and annealed to provide a photoactive layer. Thereby, a photoactive layer of a bulk heterojunction (BHJ) solar cell is prepared.

Comparative Example 2

BHJ Solar Cell Fabrication

A BHJ solar cell is fabricated in accordance with the same procedure as in Example 5, except that the self-assembled monolayer is not formed.

Comparative Example 3

BHJ Solar Cell Fabrication

A BHJ solar cell is fabricated in accordance with the same procedure as in Example 5, except that γ-aminopropyl triethoxysilane obtained from Comparative Example 1 is added instead of the γ-aminopropyl triethoxysilane and n-octyl triethoxysilane in a mole ratio of 3:1.

Experimental Example 1

Dipole Moment and Surface Energy Measurement

The dipole moment of the self-assembled monolayers obtained from Examples 1 to 3 is calculated depending upon the composition ratio of the self-assembled monolayer precursor solution, and the surface energy thereof is measured. The results are shown in FIG. 5 to FIG. 7.

The dipole moment is calculated by a density functional theory method through a computer simulation using the Gaussian03 software, and using reference average values published for the different functional groups.

The surface energy is assessed by measuring the contact angle with water and diiodomethane and calculated using a Wu model. This model gives the two components of the surface energy, i.e. polar component and dispersive component, based on the harmonic mean equation for the calculaton of interfacial tension between the liquids and the solid.

Figure 5:
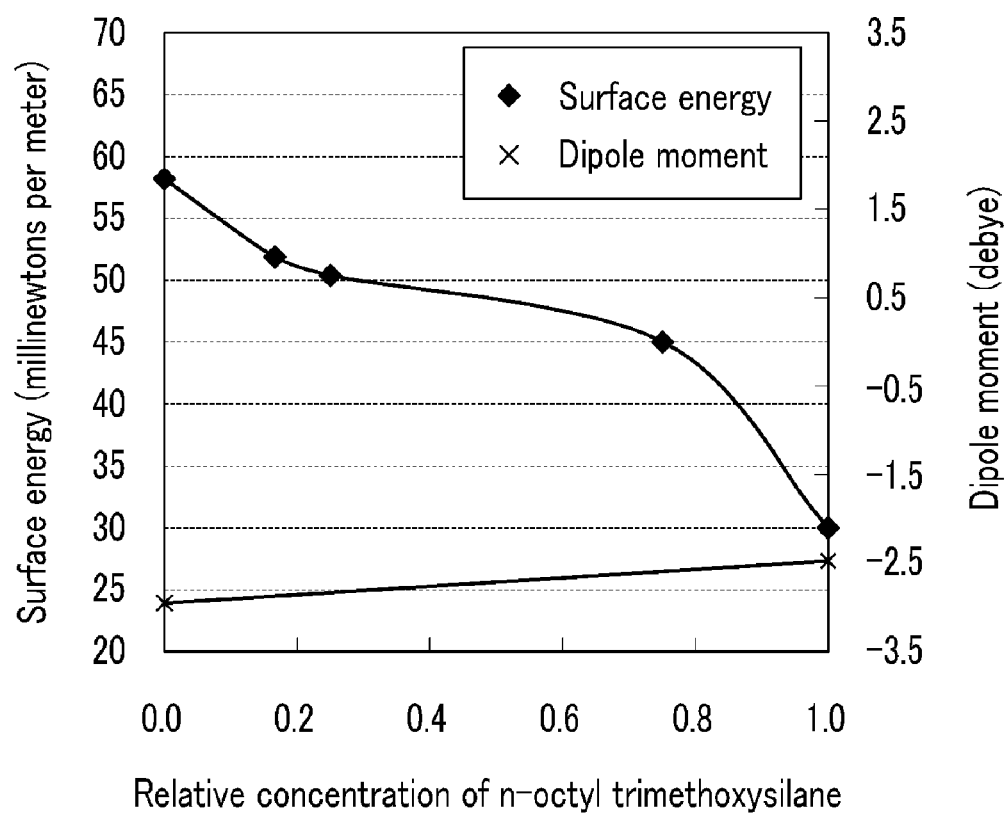
FIG. 5 is a graph showing dipole moment and surface energy versus relative concentration of n-octyl trimethoxysilane in the self-assembled monolayer precursor solution according to Example 1.
Figure 6:
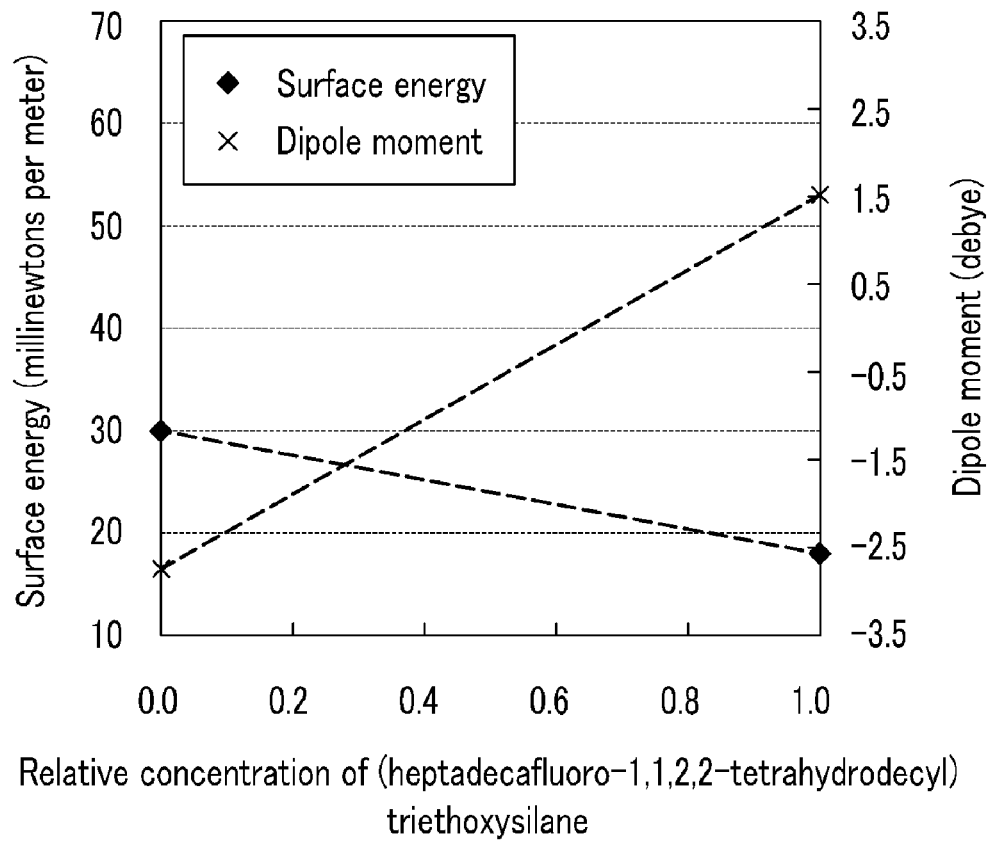
FIG. 6 is a graph showing dipole moment and surface energy versus relative concentration of (heptadecafluoro-1,1, 2,2-tetrahydrodecyl) triethoxysilane in the self-assembled monolayer precursor solution according to Example 2.
Figure 7:
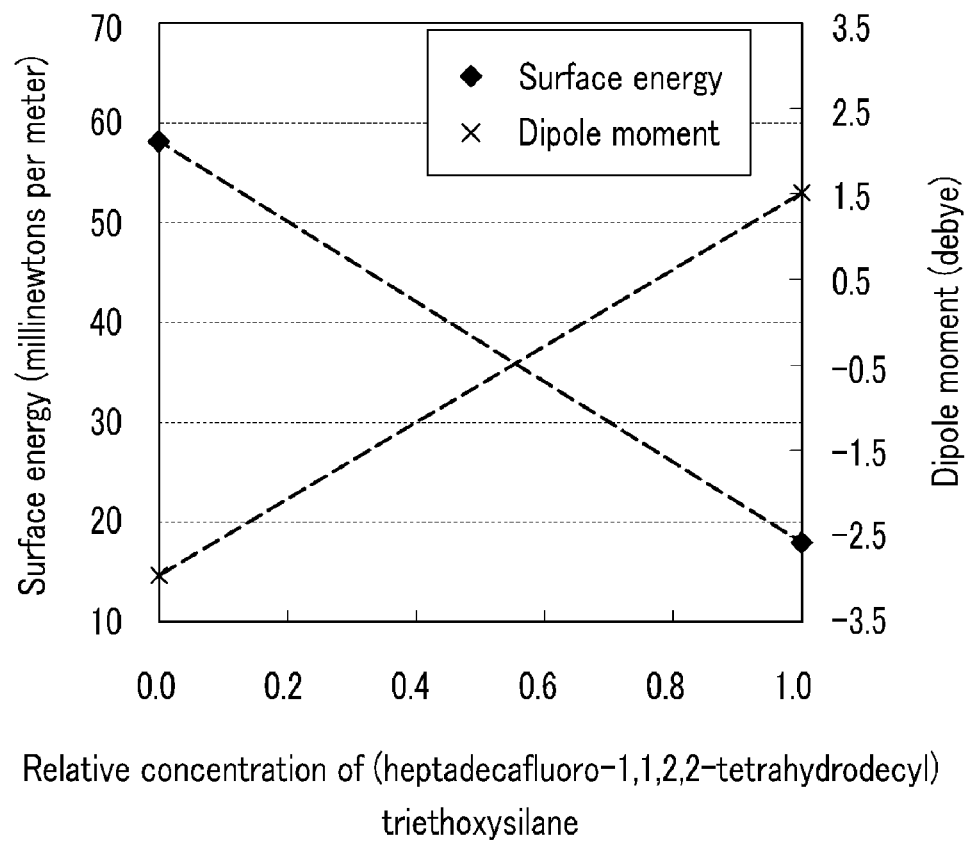
FIG. 7 is a graph showing dipole moment and surface energy versus relative concentration of (heptadecafluoro-1,1, 2,2-tetrahydrodecyl) triethoxysilane in the self-assembled monolayer precursor solution according to Example 3.

As shown in FIG. 5 to FIG. 7, it is confirmed that the self-assembled monolayer having two different functional groups from each other may selectively control the dipole moment and the surface energy by selection of the ratio of the two functional groups.

Experimental Example 2

Uniformity Analysis of a Photoactive layer of a BHJ Solar Cell

Each photoactive layer of the BHJ solar cells obtained from Example 4 and Comparative Example 1 are measured for surface roughness from the upper side by atomic force microscopy ("AFM") photography to assess the uniformity of the photoactive layer. Each AFM photograph is shown in FIG. 8 and FIG. 9, and the root mean square ("RMS") surface roughness is 5.1 nm and 10.1 nm, respectively.

Figure 8:
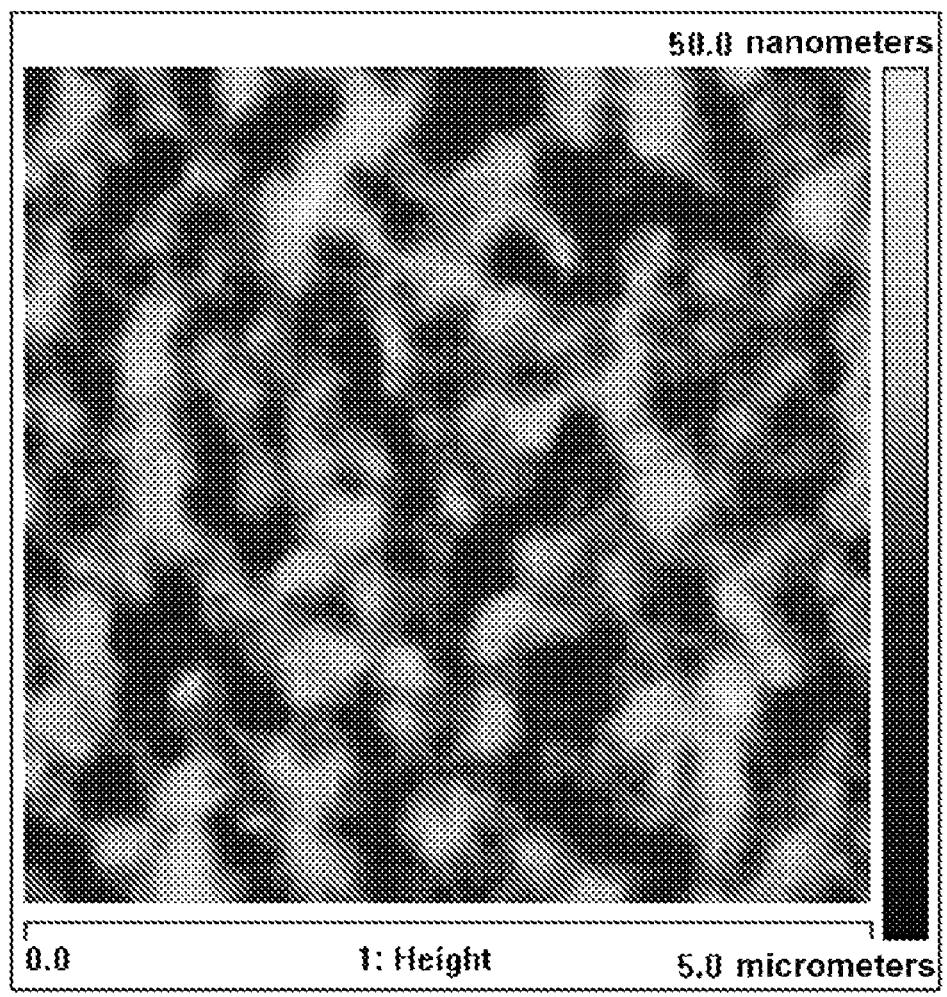
FIG. 8 is an atomic force microscopy ("AFM") photograph showing an upper side of the photoactive layer of the bulk heterojunction ("BHJ") solar cell according to Example 4.
Figure 9:
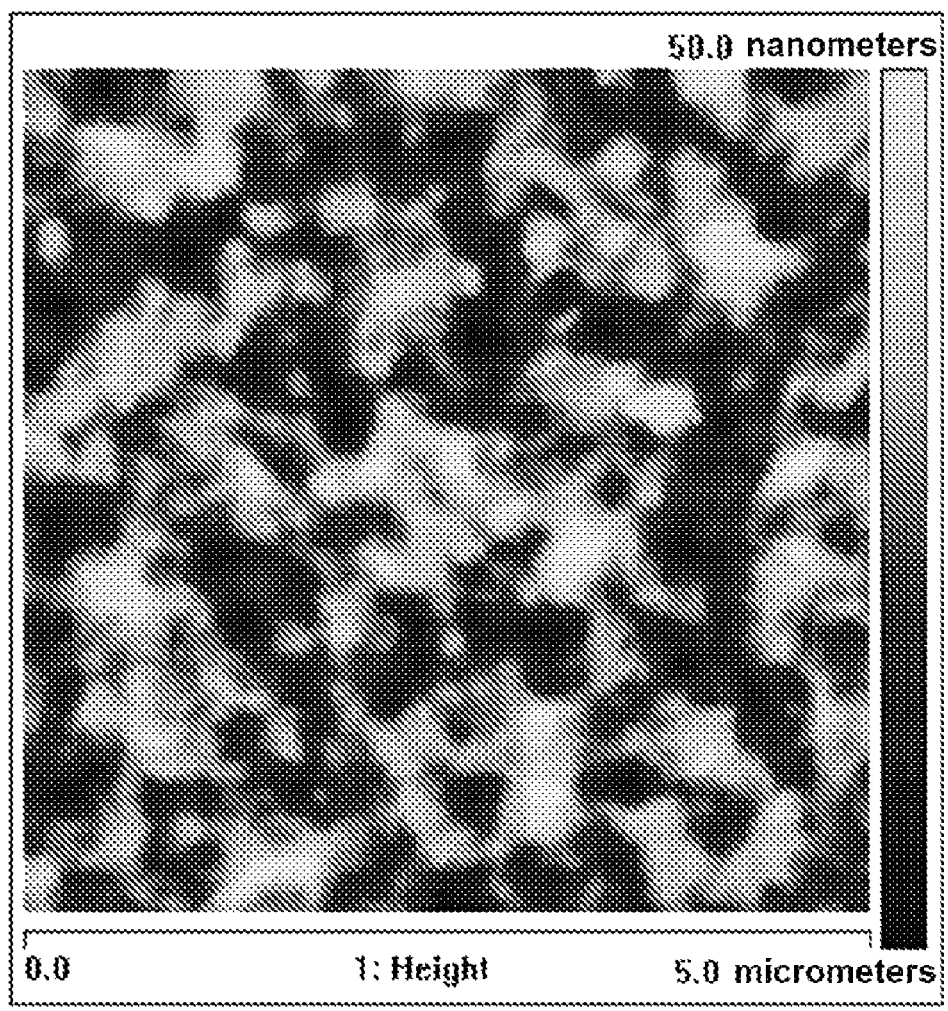
FIG. 9 is an AFM photograph showing an upper side of the photoactive layer of the BHJ solar cell according to Comparative Example 1.

As shown in FIG. 8, the photoactive layer of the BHJ solar cell obtained from Example 4 has a surface roughness, which is 50% lower than the RMS surface roughness of Comparative Example 1. Thereby, it is confirmed that the p-type semiconductor material and the n-type semiconductor material are uniformly formed. On the other hand, as shown in FIG. 9, in the photoactive layer of the BHJ solar cell obtained from Comparative Example 1, the p-type semiconductor material and the n-type semiconductor material are not uniformly mixed and are coarsely bound.

Experimental Example 3

Analyzing Efficiency of BHJ Solar Cell

The BHJ solar cells obtained from Example 5 and Comparative Examples 2 and 3 are tested to determine the photoelectric current and the voltage, in order to determine the open circuit voltage, the current density, and the fill factor, and the photoelectric conversion efficiency is assessed therefrom. The intensity of incident light is maintained at 100 milliwatts per square centimeter ($mW/cm^2$) by using an artificial sunlight irradiating device (manufactured by Oriel, 1 kW light source), and the sun condition (AM 1.5) of an artificial sunlight irradiating device is compensated using a standard silicon solar cell (authenticated by the US National Renewable Energy Laboratory "NREL"). The results are shown in the following Table 2.

TABLE 2

| Solar cell No. | Efficiency (percent, "%") |
|---|---|
| Example 5 | 1.7 |
| Comparative Example 2 | 0.9 |
| Comparative Example 3 | 1.0 |

As shown in Table 2, it is confirmed that the BHJ solar cell obtained from Example 5 has better efficiency than the BHJ solar cells obtained from Comparative Examples 2 and 3.

While this disclosure has been described in connection with exemplary embodiments, it is to be understood that the invention is not limited to the disclosed embodiments, but, on the contrary, is intended to cover various modifications and equivalent arrangements included within the spirit and scope of the appended claims.

What is claimed is:

1. An optoelectronic device comprising:
a first electrode;
an active layer disposed on the first electrode;
a second electrode disposed on the active layer; and
a self-assembled monolayer interposed between the first electrode and the active layer, interposed between the active layer and the second electrode, or disposed inside the active layer,
wherein the self-assembled monolayer comprises a first compound and a second compound having different functional groups from each other, and
wherein the first compound and the second compound are independently represented by the following Chemical Formulas 1 and 2:

*-A$_1$-B$_1$-X$_1$  Chemical Formula 1

*-A$_2$-B$_2$-X$_2$  Chemical Formula 2 wherein, in the above Chemical Formulas 1 and 2,
A$_1$ and A$_2$ are the same or different, and are independently selected from the group consisting of a thiol derivative, an alcohol derivative, and alkoxysilane derivative, a halosilane derivative, a carboxylic acid derivative, and a combination thereof,
B$_1$ and B$_2$ are the same or different, and are independently selected from the group consisting of a single bond, a substituted or unsubstituted C$_1$ to C$_{30}$ alkylene, a substituted or unsubstituted C$_1$ to C$_{30}$ alkenylene, a substituted or unsubstituted C$_1$ to C$_{30}$ alkynylene, a derivative thereof, and a combination thereof, and
X$_1$ and X$_2$ are functional groups that are different from each other, and are independently selected from the group consisting of hydrogen, a substituted or unsubstituted C$_1$ to C$_{30}$ alkyl, a substituted or unsubstituted C$_2$ to C$_{30}$ alkenyl, a substituted or unsubstituted C$_2$ to C$_{30}$ alkynyl, a substituted or unsubstituted C$_3$ to C$_{30}$ cycloalkyl, a substituted or unsubstituted C$_3$ to C$_{30}$ cycloalkenyl, a substituted or unsubstituted C$_5$ to C$_{30}$ cycloalkynyl, a substituted or unsubstituted C$_1$ to C$_{30}$ alkoxy, a substituted or unsubstituted C$_1$ to C$_{30}$ carbonyl, a substituted or unsubstituted C$_1$ to C$_{30}$ carboxyl, a substituted or unsubstituted C$_2$ to C$_{30}$ (meth) acrylate, a substituted or unsubstituted C$_2$ to C$_{30}$ epoxy, a substituted or unsubstituted C$_6$ to C$_{30}$ aromatic group, a substituted or unsubstituted C$_3$ to C$_{30}$ heterocyclic group, a thiol, a hydroxy, an amine, a nitro, a cyano, a halogen, a derivative thereof, and a combination thereof.

2. The optoelectronic device of claim 1, wherein the active layer comprises a first active part disposed on the first electrode, and
a second active part disposed on the second electrode,
wherein the self-assembled monolayer is interposed between the first electrode and the first active part, interposed between the first active part and the second active part, or interposed between the second active part and the second electrode.

3. The optoelectronic device of claim 2, wherein the first active part, the second active part, or a combination thereof comprises a fine pattern.

4. The optoelectronic device of claim 1, wherein the active layer includes an electron donor and an electron acceptor.

5. The optoelectronic device of claim 4, wherein the active layer further comprises a nanostructure, and the nanostructure contacts the first electrode or the second electrode.

6. The optoelectronic device of claim 1, wherein X$_1$ and X$_2$ are different functional groups from each other, and are independently selected from the group consisting of n-octyl, acetoxy, acetyl, acryloxyethoxy, acryloxy, allylamino, allyl, allyloxy, amino, γ-aminopropyl, benzyl, benzyloxy, carbomethoxy, cyano, cyclopentadienyl, cyclopentyl, glycidoxy, methacryloxy, imidazole, methoxyphenyl, methylamino, methylpropenyl, naphthyl, phenyl, phenoxy, phenylacetoxy, phenylamino, pyridine, pyrrole, tolyl, thiol, vinyl, fluoro, trifluoromethyl, pentafluoroethyl, tridecafluorohexyl, heptadecafluorooctyl, heptadecafluoro-1,1,2,2-tetrahydrodecyl, chloro, bromo, bromophenyl, bromovinyl, iodo, a derivative thereof, and a combination thereof.

7. The optoelectronic device of claim 1, wherein X$_1$ is a hydrophilic functional group and X$_2$ is a hydrophobic functional group.

8. The optoelectronic device of claim 7, wherein X$_1$ is a functional group selected from the group consisting of an amine, a carboxyl, an epoxy, a thiol, a (meth)acrylate, a derivative thereof, and a combination thereof.

9. The optoelectronic device of claim 7, wherein X$_2$ is a functional group selected from the group consisting of —CH$_3$, —OCH$_3$, a fluorinated derivative thereof, a derivative thereof, and a combination thereof.

10. The optoelectronic device of claim 1, wherein X$_1$ is an electron-donating functional group and X$_2$ is an electron-withdrawing functional group.

11. The optoelectronic device of claim 10, wherein X$_1$ is a functional group selected from the group consisting of —NH$_2$, —OCH$_3$, —CH$_3$, a derivative thereof, and a combination thereof.

12. The optoelectronic device of claim 10, wherein X$_2$ is a functional group selected from the group consisting of —NO$_2$, —CN, —F, —Br, —SH, a derivative thereof, and a combination thereof.

13. The optoelectronic device of claim 1, wherein the optoelectronic device is a solar cell or an organic light emitting diode.

* * * * *